United States Patent
Tatum et al.

(10) Patent No.: US 6,734,981 B1
(45) Date of Patent: May 11, 2004

(54) MULTIPLE LASER OPTICAL SYSTEMS AND METHODS

(75) Inventors: Jimmy A. Tatum, Plano, TX (US); James K. Guenter, Garland, TX (US)

(73) Assignee: Honeywell International Inc., Morristown, NJ (US)

( * ) Notice: Subject to any disclaimer, the term of this patent is extended or adjusted under 35 U.S.C. 154(b) by 378 days.

(21) Appl. No.: 09/724,819

(22) Filed: Nov. 28, 2000

(51) Int. Cl.[7] ............................................. G01B 11/24
(52) U.S. Cl. ........................................ 356/621; 33/707
(58) Field of Search .................... 356/28, 621; 33/1 M, 33/707; 250/231.1, 231.13, 231.14, 231.16; 341/31

(56) References Cited

U.S. PATENT DOCUMENTS

| | | | | |
|---|---|---|---|---|
| 4,037,157 A | * | 7/1977 | Campbell | 324/175 |
| 4,178,685 A | | 12/1979 | Inaga | |
| 4,221,963 A | * | 9/1980 | Fushimi | 250/231.14 |
| 4,459,487 A | | 7/1984 | Leser | |
| 4,509,075 A | | 4/1985 | Simms et al. | |
| 4,900,913 A | * | 2/1990 | Muro | 356/621 |
| 5,166,741 A | * | 11/1992 | Gempe et al. | 356/28 |
| 5,266,810 A | | 11/1993 | Murphy | |
| 5,382,785 A | | 1/1995 | Rink | |
| 5,635,724 A | | 6/1997 | Higgins | |
| 5,793,485 A | | 8/1998 | Gourley | |
| 5,835,613 A | | 11/1998 | Breed et al. | |
| 5,866,915 A | | 2/1999 | Pryor et al. | |
| 6,091,504 A | | 7/2000 | Walker et al. | |
| 6,115,111 A | | 9/2000 | Korah et al. | |
| 6,203,985 B1 | | 3/2001 | Jiang et al. | |
| 6,288,644 B1 | | 9/2001 | Mathews et al. | |
| 6,313,460 B1 | * | 11/2001 | Haas et al. | 250/231.13 |
| 6,316,763 B1 | | 11/2001 | Appleyard et al. | |
| 6,353,502 B1 | | 3/2002 | Marchant et al. | |

FOREIGN PATENT DOCUMENTS

| | | |
|---|---|---|
| DE | 44 04 483 A1 | 8/1995 |
| WO | WO 88 00745 A | 1/1988 |

OTHER PUBLICATIONS

Patent Cooperation Treaty, International Search Report, Aug. 5, 2002, for PCT counterpart PCT/US 01/44401 of this US patent application.

* cited by examiner

*Primary Examiner*—Richard A. Rosenberger
(74) *Attorney, Agent, or Firm*—Andrew A. Abeyta; Ortiz & Lopez, PLLC (57) ABSTRACT

A multiple laser optical sensing system and method for detecting target characteristics are disclosed. The system includes a laser source with at least two emission apertures from which laser signals are emitted. The system also includes at least one detector, which is operationally responsive to the laser source. Finally, the system includes a microprocessor that is operationally coupled to the detector (s). In operation, the laser source emits into an environment at least two laser signals, one from each emission aperture. The detector detects the laser signals after the signals pass through the environment, which is occupied by a target and the microprocessor determines target characteristics based on the laser signals received by the detector(s).

15 Claims, 9 Drawing Sheets

FIG. 9

MULTIPLE LASER OPTICAL SYSTEMS AND METHODS

RELATED CO-PENDING APPLICATIONS

The present invention is related to the following co-pending patent applications: Ser. No. 09/834,242 entitled "Trainable Laser Optical Sensing Systems and Methods," filed Apr. 12, 2001; Ser. No. 09/834,220 entitled "Systems and Methods for Optically Identifying Objects," filed Apr. 12, 2001; Ser. No. 09/834,243 entitled "Motion Sensinig System and Methods," filed Apr. 12, 2001; and Ser. No. 09/834,244 entitled "Laser Optical Area Scanner and Response System," filed Apr. 12, 2001.

TECHNICAL FIELD

The present invention relates generally to the field of sensing. More specifically, the present invention relates to multiple laser optical sensing systems and methods.

BACKGROUND OF THE INVENTION

Previous approaches to addressing sensing needs have generally involved using a single light signal from a light source, such as a light emitting diode, and multiple detectors. In order to illuminate a large area in an environment using a single light source, two general methods are known. One approach typically involves emitting a broad light signal from the light source and detecting the signal with one of multiple detectors positioned throughout the environment. The other approach typically involves emitting a narrow light signal from the light source, spreading the signal around the environment by reflecting it off of a rotating mirror, for instance, and detecting the signal with one of multiple detectors positioned throughout the environment. While feasible both approaches typically require multiple detectors and are usually not power efficient as a result, yielding a low signal-to-noise ratio. A poor power-transfer ratio reflects this inefficiency as the individual detector that receives a light signal usually detects only a portion of the signal that was originally emitted. Consequently, the signal that was detected generally provides only limited information about a target being sensed in the environment. These approaches also tend to limit the size range of the target being sensed in an environment due to the nature of the single light signal.

The limitations of these previous approaches are often manifested in applications such as detecting the motion of a target in an environment. Many motion detection systems generally involve a line-of-sight operation, where at least one detector detects the motion of a target as the target breaks a beam of light emitted from a light source. In relatively simple applications, such as determining the presence or absence of a target, this approach generally suffices. For more complex applications, such as determining the direction of the target's motion, this approach proves less adequate. When a target moves across a single light signal emitted by a light source, the signal received by a detector gradually decreases as the signal blocked by the target gradually increases. This gradual change in signal detection typically requires a complex algorithm to determine the position of the target in the environment. Adding multiple detectors can provide more information and decrease the complexity of the algorithm required, although that introduces power inefficiencies as mentioned previously, as well as added cost associated with additional hardware.

The limitations of the aforementioned approaches also relate to applications involving target recognition. Many known systems, either for recognizing only specific targets or for mapping spatial characteristics of targets, involve spreading a light signal with a rotating mirror and/or using multiple detectors. Holograms may also be used to spread the light signal by dividing the signal into smaller light signals. An approach for detecting only specific targets involves emitting pulses of signals from a transceiver, receiving the signals that reflect off of a target, and comparing the received signals with preset signals reflected off of known targets. Information about the known objects is typically stored in a database. An approach for mapping a target involves superimposing light signals received by different detectors in the presence of a target and comparing the signals with respect to signals associated with the environment without the target.

While each of these approaches is feasible for a particular function, none is known to perform several functions. This deficit creates a need for a versatile system that is both power efficient and cost effective. Such a system could be capable of, for instance, detecting the presence or absence of any target or of a specific target, detecting the spatial characteristics of a target, detecting the motion of any target or a specific target, or detecting various characteristics about the motion of a target.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

An aspect of the present invention includes a multiple laser optical sensing system for detecting target characteristics using a vertical cavity surface emitting laser. The system can include a vertical cavity surface emitting laser structure with at least two emission apertures that could be defined by photolithography. A laser signal can be emitted into an environment from each of the emission apertures. The system can also include at least one detector that is operationally responsive to the vertical cavity surface emitting laser structure. Finally, the system can include a microprocessor that is operationally coupled to the detector(s). In operation, the vertical cavity surface emitting laser structure can emit at least two laser signals into the environment, which may be occupied by a target. At least one detector detects the laser signals once they have passed through the environment. The microprocessor can then determine target characteristics based on laser signals received by the detector(s). Within the same vertical cavity surface emitting laser structure, the laser signals emitted could be identical or not identical. Optics can also be added to the system, such that laser signals pass through at least one lens or reflect off of a mirror or mirrors after exiting the emission apertures.

An aspect of the present invention provides methods for detecting target characteristics transmissively or reflectively using a vertical cavity surface emitting laser. In a transmissive method, a vertical cavity surface emitting laser structure can statically emit at least two laser signals into an environment, which may be occupied by a target. The target can block at least one of the laser signals passing through the environment, and at least one detector can transmissively receive any of the signals not blocked by the target. A microprocessor can then determine target characteristics by comparing characteristics of the laser signals emitted by the vertical cavity surface emitting laser structure with characteristics of the signals received by the detector(s).

In a reflective method, a vertical cavity surface emitting laser structure can serially emit at least one laser signal at a time into an environment, which may be occupied by a target. At least one of the laser signals can reflect off of the target and can be detected by at least one detector. A microprocessor can then determine target characteristics by comparing temporal characteristics, of the laser signals emitted by the vertical cavity surface emitting laser structure with temporal characteristics of the signals received by the detector(s).

In any method of the present invention, a microprocessor could determine the size or shape of a target by determining which laser signals are received by a detector after different arrays of laser signals are emitted by a vertical cavity surface emitting laser structure. The microprocessor could also detect motion of the target in an environment by detecting changes in the array of laser signals that are blocked or reflected off of the target.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the scope of the invention will become apparent to those of skill in the art from the detailed description of the invention and claims that follow.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate an embodiment of the present invention and are not intended to limit the scope of the invention.

Figure 1:
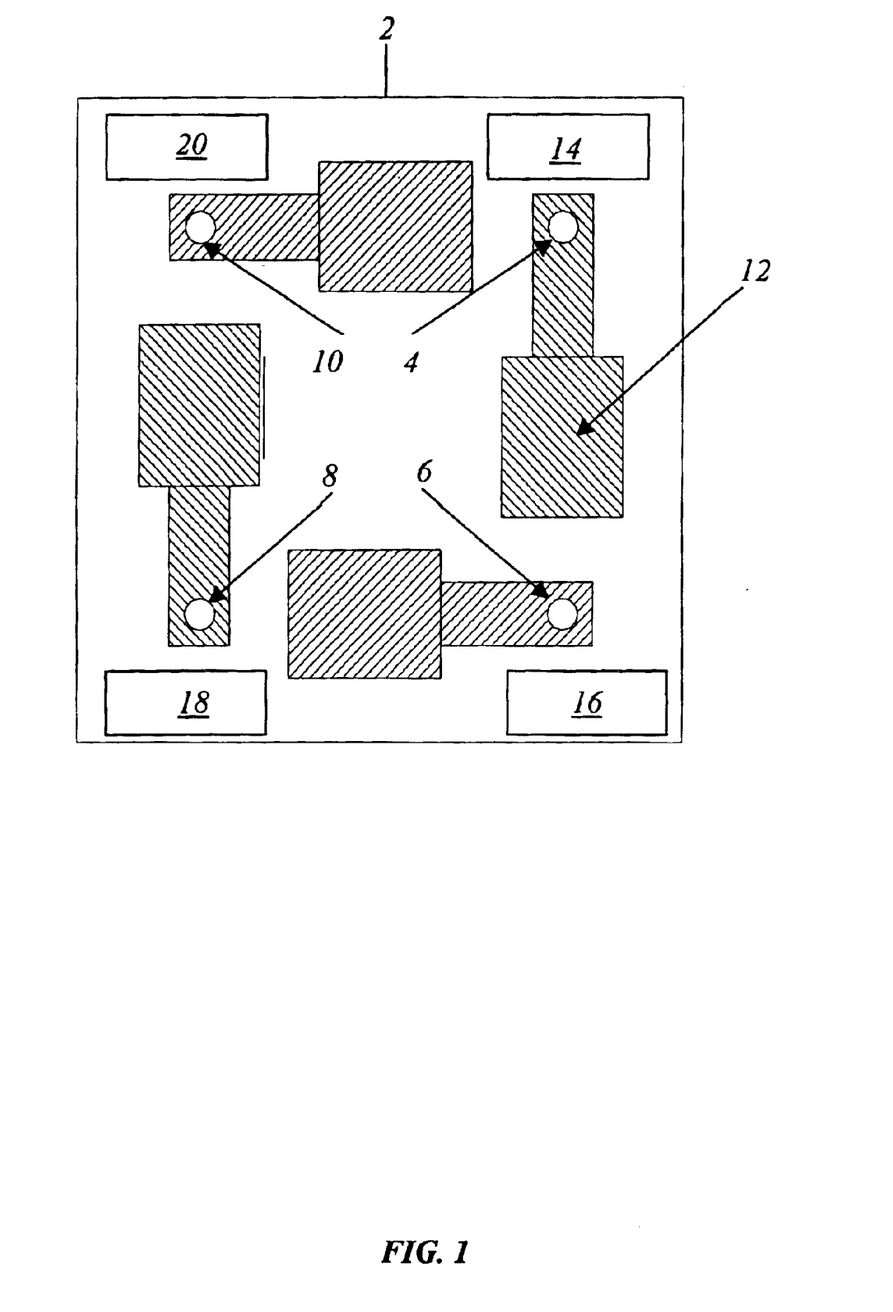
FIG. 1 illustrates a diagram of a vertical cavity surface emitting laser structure.

In the following example of this embodiment, FIG. 1 shows a vertical cavity surface emitting laser (VCSEL) structure 2 with a plurality of emission apertures 4, 6, 8, and 10. Emission apertures 4 can be fabricated by using either proton isolation or dielectric oxide techniques to provide both carrier and optical confinement. Emission aperture 4, for instance, is functionally integrated with a bond pad 12 and is electrically coupled to an element 14. Elements 16, 18, and 20 are also shown and can be identical or not identical to each other and to element 14. Upon powering elements, emission apertures emit light signals (not shown) perpendicular to VCSEL structure 2, making them especially amenable to the fabrication of both one and two-dimensional arrays. While the example shown in FIG. 1 (and other figures) comprises a 2×2 array of emission apertures, it should be noted that the fabrication of M×N arrays is also feasible and that the 2×2 array is only provided herein to simplify explanation.

One of the principle advantages to array fabrication using VCSEL structure 2 is that all of the dimensions in the array can be fabricated using photolithography, thereby incorporating high-dimensional tolerances on the placement of the emission apertures. As a result, the high-dimensional tolerance produces a precisely defined array of light signals emitted and enables the fabrication of any one or two-dimensional array desired, such as the pattern of a cross. The elements can be electrically connected in virtually any manner desired as well, permitting light signals to be emitted individually or in groups. Light signals can be emitted in single or multiple spatial modes and can vary in terms of divergence angles upon emission and/or the diameter of the light signal upon being focused. Light signals can also be emitted in single or multiple wavelengths. By using advanced selective epitaxial techniques, light signals of widely separated wavelengths can be fabricated.

Figure 2:
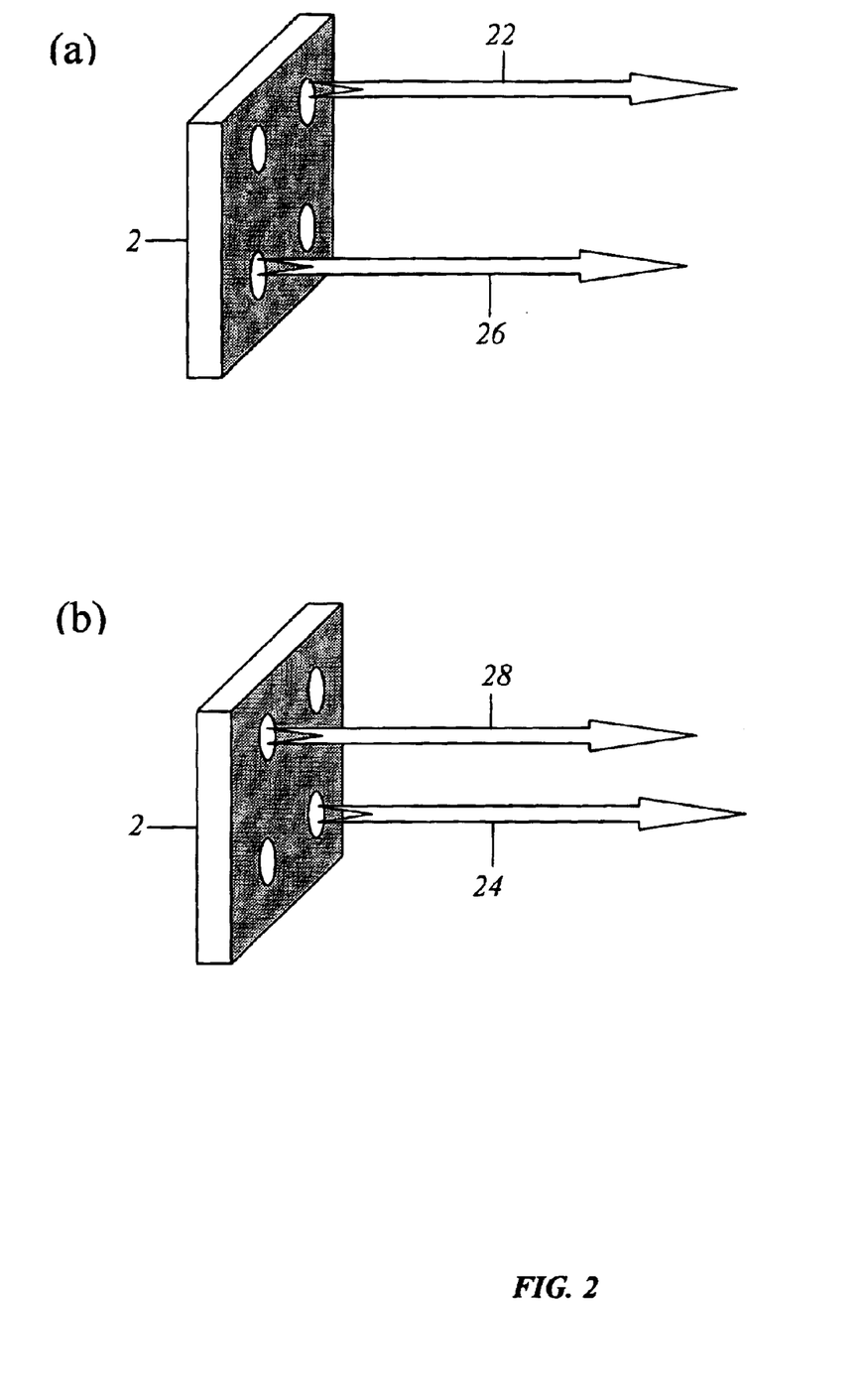
FIG. 2 illustrates diagrams of a vertical cavity surface emitting laser structure emitting two different patterns of light signals (a) and (b).

FIG. 2 illustrates the illumination of different patterns of light signals by the same VCSEL structure 2. In FIG. 2(a), emission aperture 4 emits light signal 22 while aperture 8 emits light signal 26. In FIG. 2(b), emission aperture 6 emits light signal 24 while aperture 10 emits light signal 28. Similarly, any other one or group of two, three, or four light signals could be emitted from a 2×2 array. It should be reiterated that any array consisting of any number of emission apertures could be constructed, permitting the emission of a variety of light signal patterns.

Figure 3:
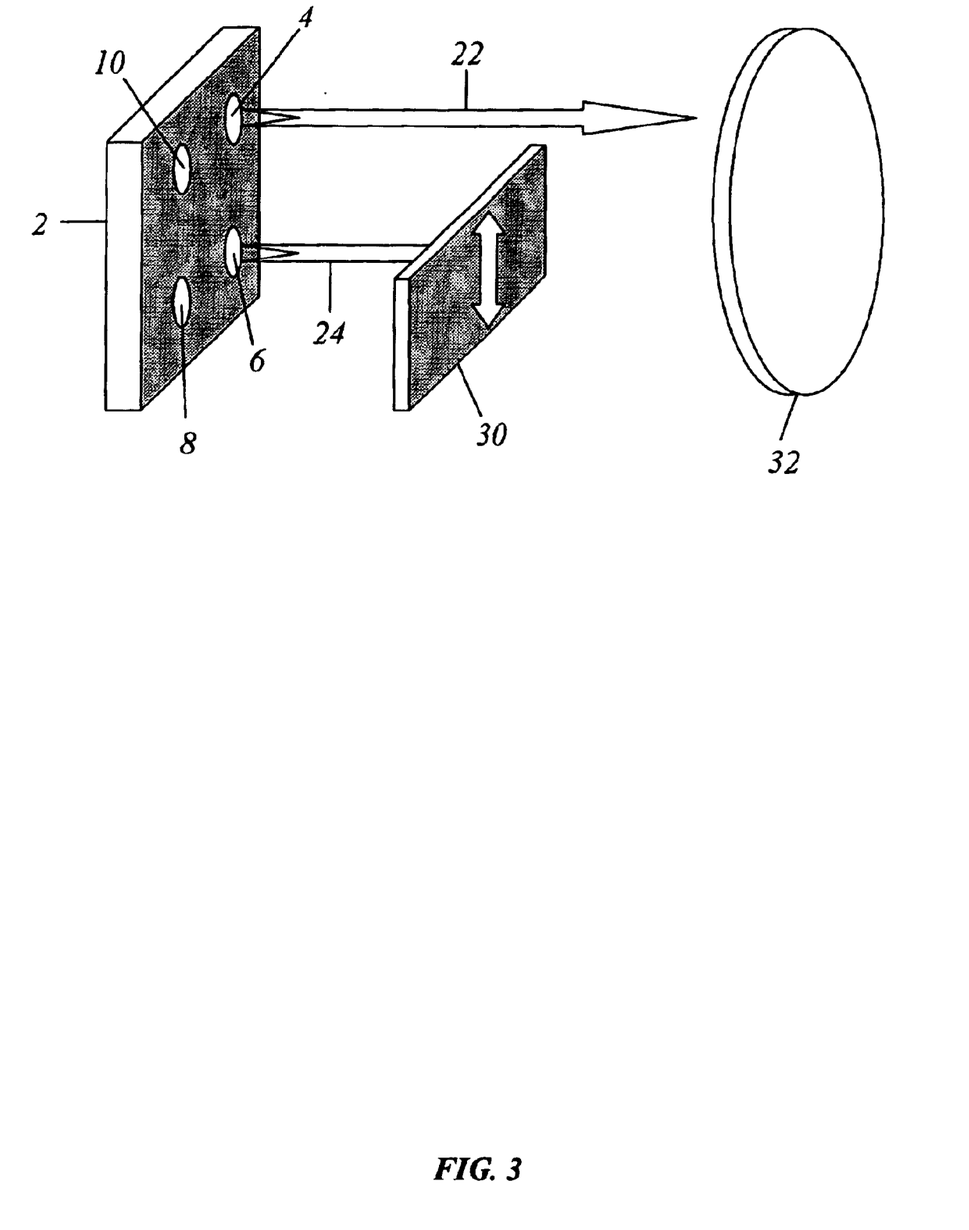
FIG. 3 illustrates a diagram of a target blocking a light signal statically emitted from a vertical cavity surface emitting laser structure before it reaches a detector.

A first preferred embodiment is a reconfigurable static structured light source, which is depicted in FIG. 3. The diagram shows VCSEL structure 2 simultaneously emitting light signals 22 and 24 into an environment from emission apertures 4 and 6, respectively. While different light signals (or sets of signals) of the array may be emitted at different times, the timing of the changes are not directly relevant to the intended function. A target 30 is positioned in the environment between VCSEL structure 2 and a detector 32, which could be any of various types such as a photodiode. A photodiode detector could either include an individual photodiode, multiple photodiodes individually packaged, or an array of photodiodes on a single structure in a single package.

As target 30 moves upward, the particular light signal received by detector 32 changes from full on (no obstruction), to half on (signal 24 blocked but not signal 22), and finally to full off (both signals 24 and 22 blocked). This happens in an essentially digital, or stepwise, fashion. A single illuminator in a similar geometry would provide only a very gradual change in detector illumination, requiring a more sophisticated algorithm to determine position at the midpoint. However, with this same VCSEL array, the identical function can be provided for target 30 moving orthogonally to that shown in FIG. 2, simply by emitting signals from apertures 6 and 8 instead of 4 and 6, for example. For detection of a diagonally-moving target, signals from apertures 4 and 8 or 6 and 10 would be emitted. Thus multiple motions could be sensed with a single detector 32 by sequentially emitting light signals from different apertures.

An extension of the concept requires larger element counts. Consider a VCSEL array with 5×2 elements, for example. If a stationary target with a corrugated edge is interposed between the VCSEL array and a detector, the corrugations will block some light signals and not others. By cycling through several fixed patterns of "lit" and "unlit" VCSELs, the detector signal can be interpreted as a map of the corrugated edge. In this way the corrugated obstruction acts as a key and the optical assembly including the VCSEL array and the detector acts as a lock. Straightforward electronics can produce locks that recognize only one or several keys. Any emission patterns that correspond in a certain way to the pattern on the target would result in a positive identification, or recognition, by the detector. In an aspect of the present invention, a microprocessor could make a positive identification by referencing a database and using a neural network to correlate the detected pattern of light signals from the target with stored patterns of signals from known targets.

Figure 4:
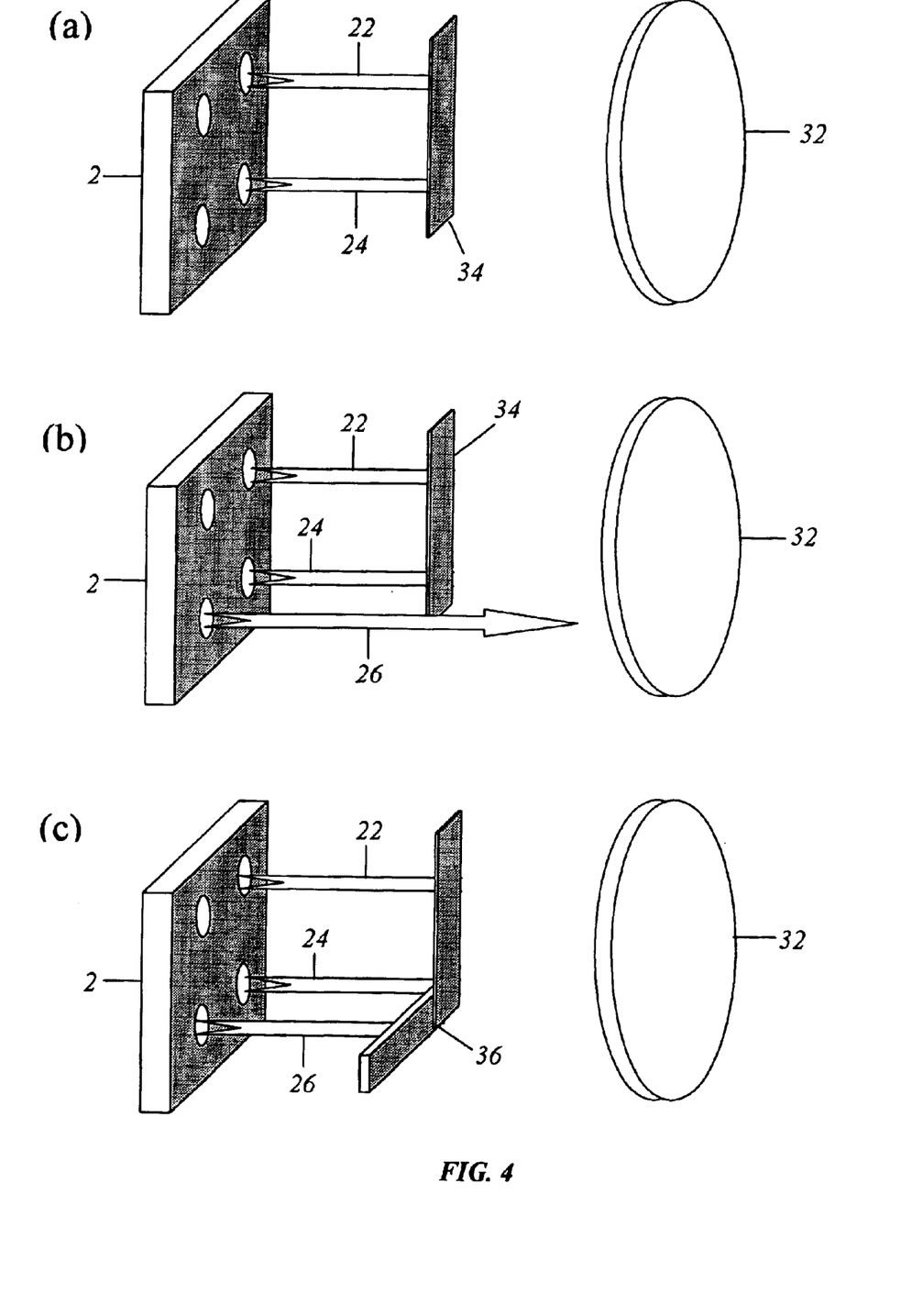
FIG. 4 illustrates diagrams of a vertical cavity surface emitting laser structure cycling through different emission patterns of light signals to determine a map of the target. In (a), light signals forming a vertical line are blocked by a vertical bar-shaped target and none reach a detector. When a different pattern of signals is emitted as in (b), forming a right angle, one signal reaches the detector. In the presence of a right angle-shaped target as in (c), however, the same right angle-shaped pattern as emitted in (b) would be blocked.

FIG. 4 illustrates VCSEL structure 2 cycling through different emission patterns of light signals to determine a map of a target. In FIG. 4(a), a vertical bar-shaped target 34 (although other geometries can be used) blocks light signals 22 and 24 from reaching detector 32. When a different pattern of signals is emitted (22, 24, and 26) as in FIG. 4(b), signal 26 reaches detector 32 while signals 22 and 24 remain blocked. Detector 32, therefore, recognizes that target 34 has no horizontal piece spatially correlated to light signal 26. In the presence of a right angle-shaped target 36 as in FIG. 4(c), however, the same right angle-shaped pattern as emitted in FIG. 4 (b) is blocked. Neither signal 22, 24, nor 26 reaches detector 32, indicating to detector 32 that target 36 (unlike target 30) does have a horizontal piece spatially correlated to light signal 26.

Figure 5:
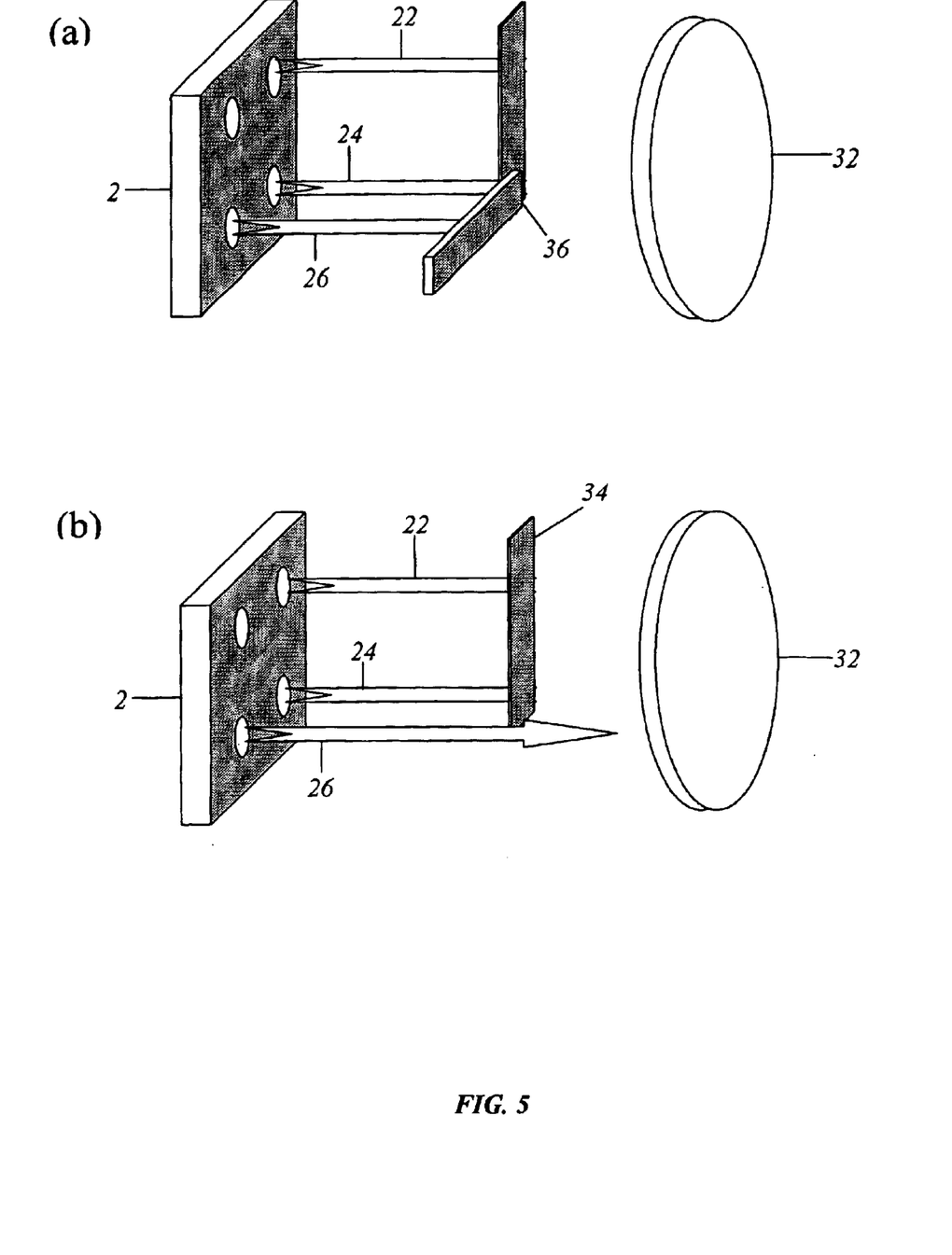
FIG. 5 illustrates diagrams of a vertical cavity surface emitting laser structure emitting the same pattern of light signals in (a) and (b). In (a), a target blocks all emitted signals, whereas in (b), a different target does not block all signals, allowing recognition of a specified target only.

FIG. 5 illustrates how a specified target can be recognized while others are not. In this example, VCSEL structure 2 emits the same pattern of light signals in FIGS. 5(a) and (b), though the shape of the target differs. In, FIG. 5(a), target 36 blocks all emitted signals 22, 24, and 26 from reaching detector 32. In FIG. 5(b), target 34 blocks only light signals 22 and 24, permitting signal 26 to reach detector 32. With the same pattern of light signals emitted, therefore, different signals will reach detector 32 depending on the shape of the particular target present in the environment. This difference subsequently could allow for recognition of a specified target when an exact "match" is made.

The aforementioned corrugated opaque obstruction is only one example of possible key configurations. Among other possibilities are arrays of holes or exposed areas on film. A possible application using film could involve using object recognition for personal identification cards, such as badge readers. Each badge might contain a small piece of exposed film that is unique to the individual, such that upon inserting the badge into a badge reader, the reader can not only grant access to the individual, but also be able to identify to whom it granted access. Combining the two concepts above with large element counts result in sensors that detect the motion only of "key"-shaped objects, ignoring others that move through.

In addition to using a plurality of light sources, the present invention could perform object recognition tasks faster than many current systems by using a camera as a detector. The camera could be one of various types including a closed-caption decoder or CMOS camera. When the camera display of a typical current system is divided into separate areas, complex image processing algorithms are often required to measure the partially blocked areas from the uniform light source. When the display of the present invention is divided into separate areas, each area has its own independent illumination differing spatially from adjacent illuminations due to the plurality of light signals emitted. As a result, all of the signals can be detected simultaneously and can be quickly summed together or otherwise combined to provide the desired information.

A target 30 could also be detected by the composition of its surface. The absorptive characteristics of the surface can absorb and/or reflect light signals differently based on the wavelength of the signals. Emitting light signals of different wavelengths, which might be accomplished by fabricating VCSEL structure 2 with different elements, could, therefore, also indicate the absorptive characteristics of the material. In either situation, detecting target 30 based on its characteristics or detecting the characteristics of target 30, a microprocessor could determine characteristics by comparing the light signals received by detector 32 with the signals emitted by VCSEL structure 2. If the difference in wavelength among the signals emitted were large enough to detect by detector 32, a plurality of detectors 32 could be used to detect signals within different ranges of wavelength to provide more detailed information about the absorptive characteristics of target 30.

In order to detect targets of various sizes, optics could be added. A lens or array of lenses can be positioned in between VCSEL structure 2 and target 30 such that the lens reproduces the pattern of emitted light signals into a larger or smaller pattern in the image plane. The emission pattern of the image would be identical in shape to the original pattern emitted but different in size. A microprocessor can then correlate the pattern of light signals received by detector 32 in the presence of target 30 with the pattern of signals originally emitted.

Figure 6:
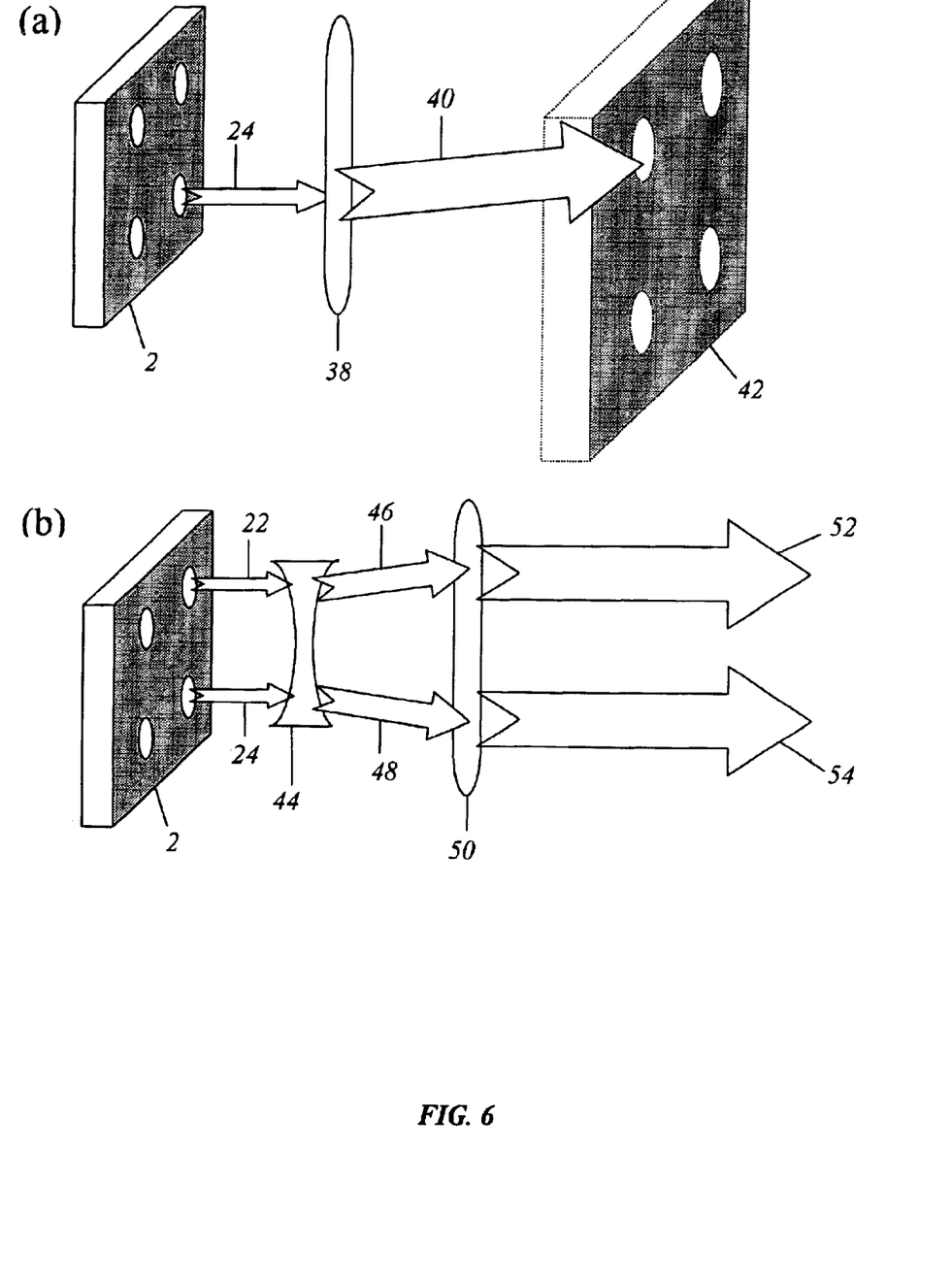
FIG. 6 illustrates diagrams of emitted light signals passing through (a) a single lens producing a magnified image of the emitted array and (b) a compound lens system producing an expanded version of the emitted array.

FIG. 6 illustrates two ways in which lenses can be used to alter the size of an array of light signals. In FIG. 6(a), a single lens 38 produces a magnified image 42 of the array emitted by VCSEL structure 2, affording detection of targets larger than the physical array. As light signal 24 enters lens 38, lens 38 magnifies signal 24 into a new light signal 40 having a larger diameter. In this particular configuration, magnified image 42 would be inverted compared to the array originally emitted by VCSEL structure 2. Two lenses could also be used in a collimator-telescope configuration (not shown). In FIG. 6(b), a compound lens system produces an expanded version of the array emitted by VCSEL structure 2. As light signals 22 and 24 enter lens 44, lens 44 diverges signals 22 and 24 creating new light signals 46 and 48, respectively. Signals 46 and 48 then enter a lens 50, which collimates signals 46 and 48 into new signals 52 and 54, respectively. These resulting signals 52 and 54 have a larger diameter than light signals 22 and 24 originally emitted. In this particular example, lens 44 diverges entering light signals, though other configurations of divergence or convergence could be used as well.

Figure 7:
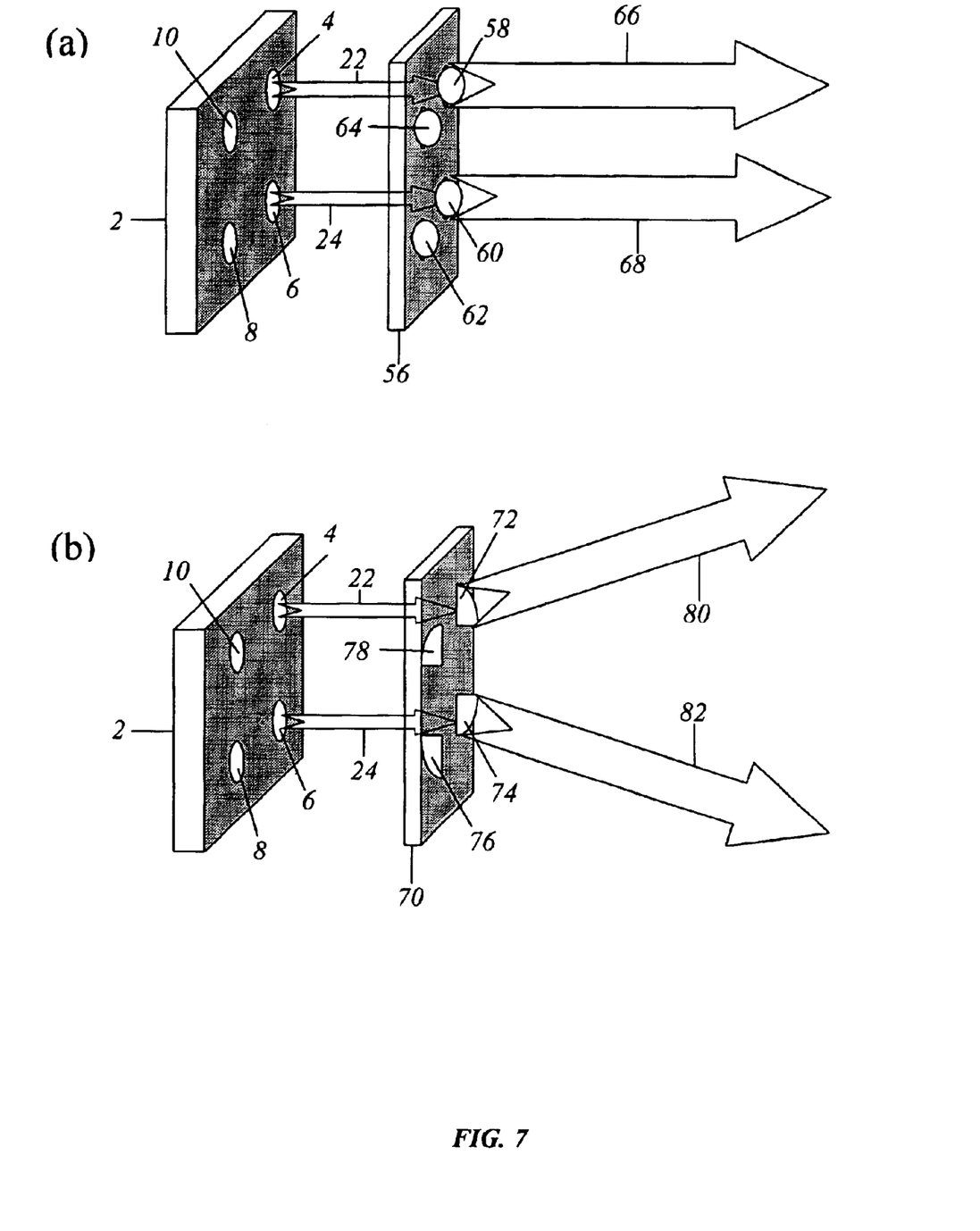
FIG. 7 illustrates diagrams of emitted light signals passing through arrays of lenses. The array of lenses in (a) expands the diameter of light signals without changing their center spacing. The array of lenses in (b) expands the diameter and changes the direction of emitted light signals.

FIG. 7 illustrates alternative configurations of arrays of lenses that can be used to alter the array of light signals emitted by VCSEL structure 2. In FIG. 7(a), lens array 56 contains lenses 58, 60, 62, and 64 that correspond spatially to emission apertures 4, 6, 8, and 10, respectively. Lens 58 expands the diameter of entering light signal 22 into new light signal 66. Similarly, lens 60 expands the diameter of signal 24 into new signal 68. While the lenses of lens array 56 alter the size of the light signals, they do not alter the center spacing of the signals and, thus, conserve the spatial characteristics of the array emitted by VCSEL structure 2.

In FIG. 7(b), lens array 70 contains lenses, 72, 74, 76, and 78 that correspond spatially to emission apertures 4, 6, 8, and 10, respectively. Lens 72 expands the diameter and changes the direction of entering light signal 22 into new light signal 80. Similarly, lens 74 expands the diameter and changes the direction of signal 24 into new signal 82. In this particular example, lens array 70 diverges entering light signals, though other configurations of divergence or convergence could be used as well.

Figure 8:
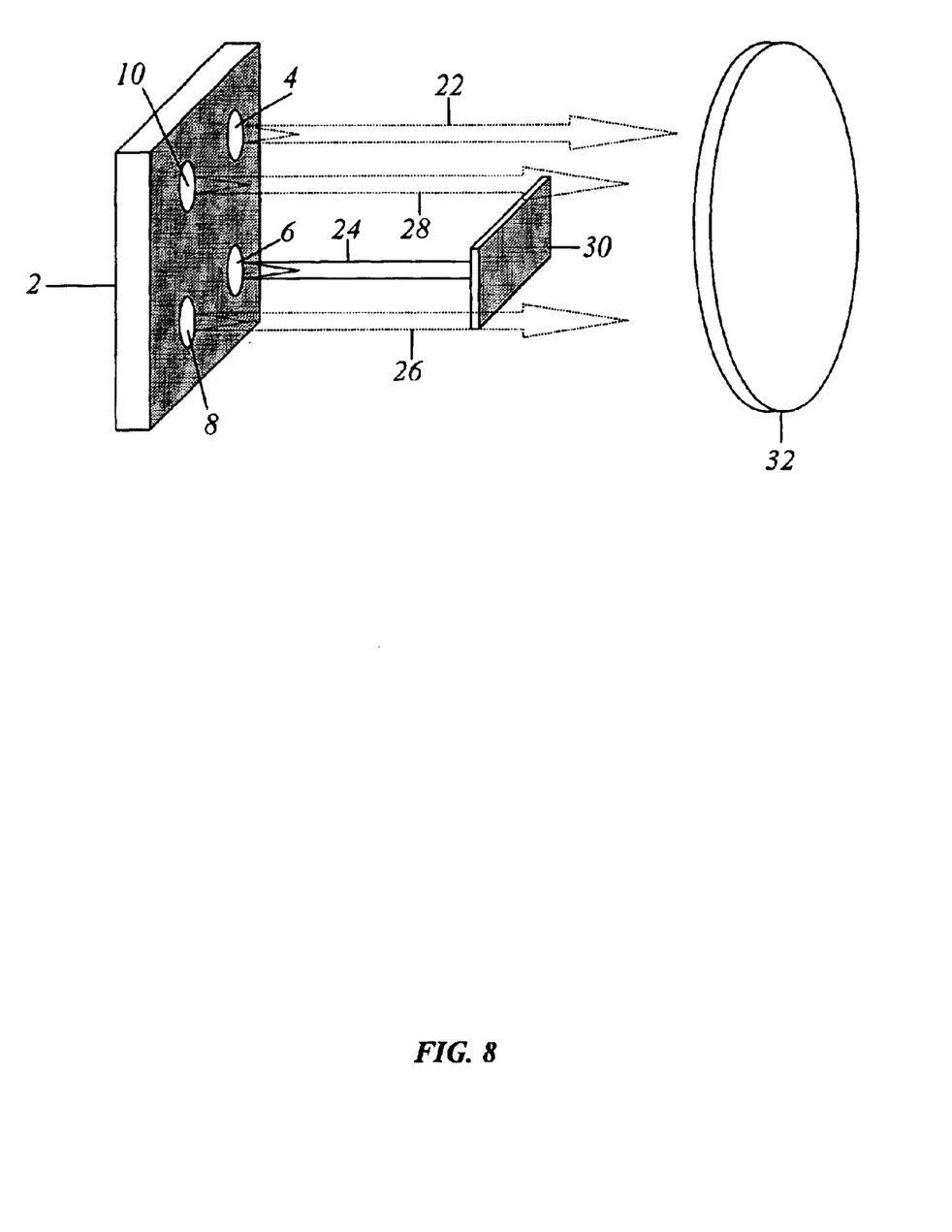
FIG. 8 illustrates a diagram of a target blocking a light signal serially emitted from a vertical cavity surface emitting laser structure before it reaches a detector.

In a second preferred embodiment, the timing of illuminating the individual elements is an integral part of the sensing process. The elements are serially illuminated in a sequence whose temporal characteristics are interpreted. In FIG. 8, VCSEL structure 2 is shown sequentially emitting light signals from emission apertures 4, 6, 8, and 10 in the order 4, 6, 8, 10, 4, 6, 8, 10, 4, 6, 8, 10, etc. Corresponding light signals 22, 24, 26, and 28 are, therefore, emitted from the emission apertures.

In this example, three light signals have already been emitted (26, 28, 22), illustrated by the dotted lines, and ones is currently lit (24). Light signal 26 has been emitted and has reached detector 32 unobstructed by target 30. Signal 28 was then emitted and similarly reached detector 32 obstructed. Light signal 22 reached target 30 next, also unobstructed. Currently, signal 24 is lit and has been blocked by target 30 before reaching detector 32. If the output of a single detector 32 disposed to receive all of the light signals in the array is monitored over time, the angular (and to a partial extent the spatial) location of target 30 is given by the absence of a signal at the time the particular signal(s) are blocked. The array need not be circular, as linear arrays or multiple concentric rings could be used to map the shape of target 30 by interpreting the time-sequence of the output of detector 32.

Figure 9:
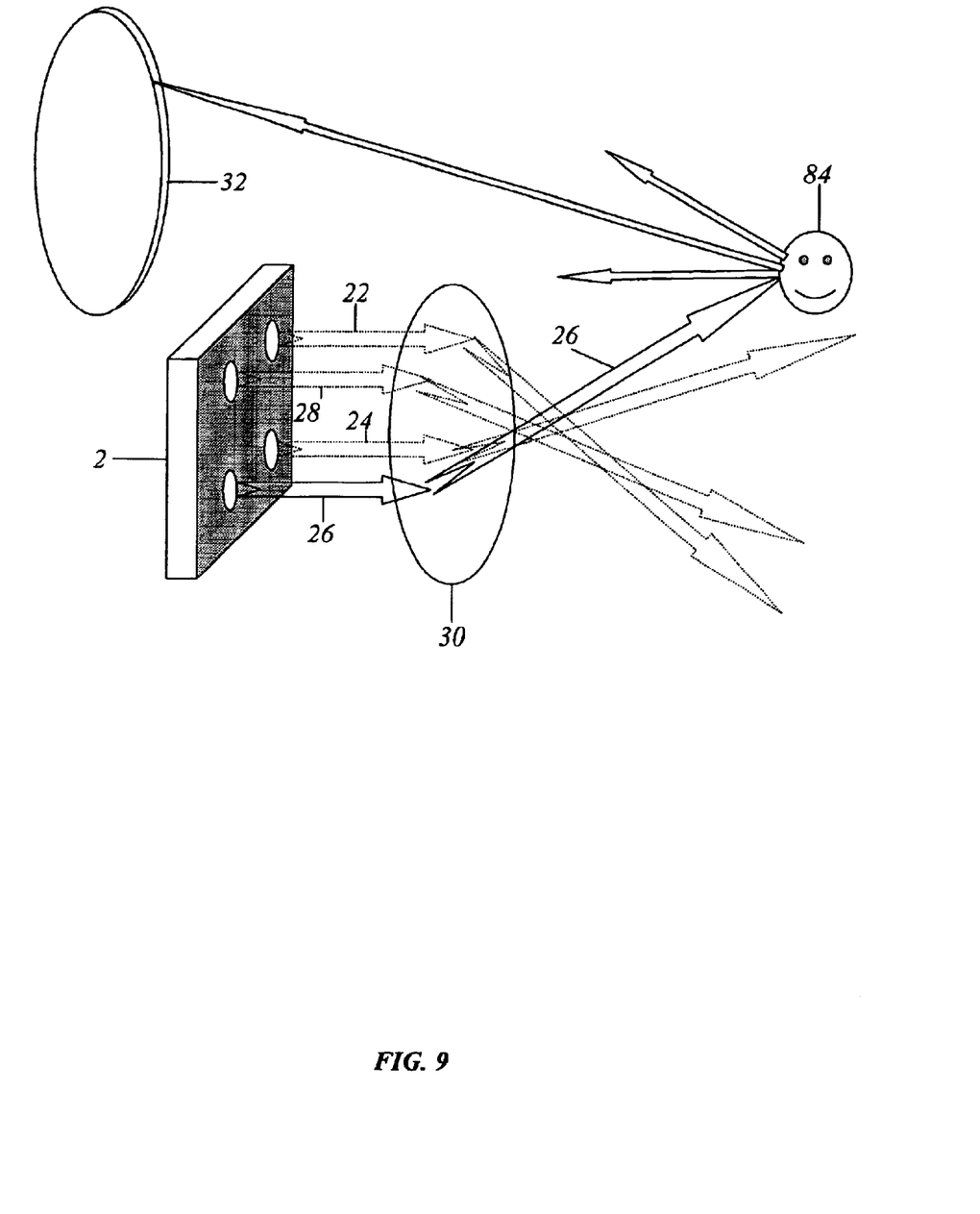
FIG. 9 illustrates how a lens can spread light signals emitted by a vertical cavity surface emitting laser structure into an environment occupied by a target, wherein an emitted signal reflects off of the target and reaches the detector.

If optics are added, as depicted in FIG. 9, then light signals can be steered into different angles. Light signals are shown passing through lens 30, positioned between VCSEL structure 2 and target 84. Lens 30 then redirects the light signals to different places in the environment, allowing a single detector 32 to sense targets 84 at widely separated locations. For example, with only ten VCSEL elements, approximately, a full half-plane of $2\pi$ steradians could be monitored.

In this example, light signals 28, 22, and then 24 have already been sequentially emitted, as denoted by the dotted lines; and light signal 26 is currently lit. After being redirected by lens 30, light signal 26 travels until it intercepts target 84. Light signal 26 then reflects off of target 84 and reaches detector 32. It should be noted that target 84 happened to be positioned in the environment such that it lies in the path of light signal 26, rather than light signal 26 specifically seeking target 84. If target 84 were, therefore, moved, it would lie in the path of a different light signal.

With linear arrays, position along an axis can be detected. One example of a "circular" array application could use a single lens above VCSEL structure 2. This lens could skew each signal into a different angle as the individual elements are sequentially illuminated. A light signal can, therefore, be directed to different areas in an environment at different times by simply illuminating different elements at different times. Measuring the temporal output of a detector disposed to collect reflected light signals can provide information on the presence of a target and of its location. Even if location information is not necessary, the effective scanning of a light signal without moving parts can provide for a purely electrical function rather than a mechanical function. This feature allows for operation at a much lower input power, which could be important in battery-powered applications where energy conservation is often critical.

A lens or array of lenses can be positioned near VCSEL structure 2 such that a lens collimates each light signal passing through. Whereas current optical systems are generally known to collimate a single light signal into one parallel group of signals, the present invention can collimate each of a plurality of signals into corresponding parallel groups. Since each light signal passes through a lens at a different angle, due to the different location of each emission aperture on VCSEL structure 2, each group of collimated signals exits a lens at a different angle.

Using optics to spread a plurality of light signals to different areas in an environment to create a "scanner" could be used in a number of applications. In a possible security or safety application, the sensing system could be used to detect the presence or absence of a person or a person's members, such as an arm which could in turn sound an alarm. Other information about the person could also potentially be determined, such as the size and shape of the person, the location within a room, and the direction and speed of movement in the room. Such information could also be obtained in machinery or equipment where safety is critical. All of such information could be determined by placing a single detector 32 in the room, positioned near to or far from VCSEL structure 2, though a plurality of detectors 32 could be used as well. A lens or array of lenses could also be placed near detector 32 to effectively expand the area from which it can receive light signals. As the detector(s) 32 receives light signals reflected off of the target and/or the walls or other objects in the room, the microprocessor processes the signals to provide the desired information.

If a plurality of detectors were used, the processing time devoted to each could be divided to optimize the type of information desired. For instance, one detector might detect solely the presence or absence of a target, while two other detectors detect differences in the wavelength of light signals received. The microprocessor could devote all of the computing power to detecting a target until a target is detected. Once detected, the microprocessor could devote the power to determining the absorptive characteristics of the target's surface. Similarly, if each emission aperture comprised a separate array of apertures, an 'array of arrays' could be used to provide both low and high levels of information. Once a detector detects a specific array of light signals, the microprocessor could focus on processing the array of light signals within that particular array to provide more detailed information.

Another application of the present invention is a lighting control system where the presence or absence of a target or person determines the operating status of lights in a room. Unlike lighting systems activated by simple motion sensors, the present invention enables the design of much more complex systems which could use the specific characteristics of a target's makeup or motion to control specific lighting patterns. For instance, a user could specify a particular group of lights in a room to turn on if a person enters the room, but not to turn on if a robotic device or other object enters. Applications could also include the control of a robot itself, or any robotic or automated process involving object recognition, motion detection, or other types of sensing.

Another application of the present invention using a one-dimensional array is detecting the angle or position in space of a wire, or other linear target. Cycling through various patterns of signal emission and comparing the light signals emitted with the signals received might indicate these variables. With the inherently rapid nature of signal emission from VCSEL structures, a microprocessor could determine and provide this information on a real-time basis, which would be important if the angle or position of the wire constantly changes.

Another application of the present invention involves printing devices, such as laser printers or copiers. Current devices typically operate by reflecting a single light signal emitted from a light source off of a rotating mirror. With the present invention, the VCSEL structure could similarly reflect a plurality of emitted light signals off of a rotating mirror. Additional reflected light signals could in turn write more information on a page and/or write at a higher resolution in the same amount of time as most current devices.

Yet another application of the present invention involves an encoder, wherein a code wheel lies between the VCSEL structure and the detector. A typical code wheel contains characteristics such as marks and/or spaces that correspond to characteristics of the detectors, wherein the characteristics of each detector vary slightly. This slight variance allows for information such as quadrature to be determined, which can then be used to determine further information such as direction of motion. Whereas most encoder systems require a plurality of detectors to create this variance, the plurality of light signals in the present invention provides the same information with a single detector. Using only one detector, rather than several, reduces the mechanical complexity of the encoder system. In operation, an emitted light signal travels through a slit in the code wheel, for example. The detector then either detects the signal or not based on its characteristic correlated to the slit. Once the first light signal turns off, the VCSEL structure emits a second signal, or group of signals, from a different emission aperture. The light signal passes through the code wheel at a different angle from the first signal emitted before reaching the detector. A microprocessor then uses the difference in angle found by comparing the different signals received by the detector to determine the quadrature and/or other information.

It should be noted that nearly all of the aforementioned applications, as well as any others, could potentially be addressed using either transmissive or reflective systems. The embodiments and examples set forth herein are, presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

The embodiments of an invention in which an exclusive property or right is claimed are defined as follows:

1. A multiple laser signal sensing system for detecting target characteristics within a room, comprising:
   a laser source adapted for operation by illumination through at least two apertures of an at least 2 aperture-by-at least 2 aperture array, said illumination there through thereby creating at least two laser signals;
   at least four emission apertures formed in an at least 2 aperture-by-at least 2 aperture array disposed between said laser source and said room; and
   at least one detector operationally responsive to receive laser signals from said room after said signals have passed through the at least two apertures;
   wherein said laser source emits light through said at least two apertures into a room occupied by a target thereby creating at least two laser signals, said at least one detector detects said at least two laser signals after said signals pass through said room, and a microprocessor coupled to said at least one detector determines characteristics of said target based on comparison of said at least two signals received by said detector with said target characteristics obtained from a memory.

2. The system of claim 1, wherein said laser source is a vertical cavity surface emitting laser.

3. The system of claim 1, wherein said detector is a closed-captioned camera.

4. The system of claim 1, wherein said detector is a photodiode.

5. A laser signal sensing system for detecting target characteristics, comprising:
   a vertical cavity surface emitting laser structure including a two-by-at least two emission aperture arrangement disposed between said vertical cavity laser structure and an environment; and
   at least one detector adapted to receive from said environment optical signals provided by said vertical cavity surface emitting laser structure through at least one aperture of said two-by-two emission aperture arrangement into said environment;
   wherein said at least one detector receives optical signals after said optical signals pass through said environment, and a microprocessor coupled to said at least one detector determines characteristics of targets freely moving within said environment based on comparison of said optical signals received by said at least one detector with target characteristics obtained from a memory by the microprocessor.

6. The system of claim 5, wherein said detector is a closed-captioned camera.

7. The system of claim 5, wherein said detector is a photodiode.

8. A method for determining target characteristics, comprising the steps of:

emitting at least two optical signals of diverse wavelengths from a vertical cavity surface emitting laser structure through at least one aperture of an at least 2 aperture-by-at least 2 aperture array into an open environment wherein targets can move freely;

receiving optical signals transmitted from said open environment; and determining target characteristics based on absorptive qualities of targets moving freely within said open environment.

9. The method of claim 8, wherein said step of determining target characteristics is also based on optical signals blocked by targets moving freely within said open environment.

10. The method of claim 8, wherein said step of determining target characteristics is also based on optical signals reflected by targets moving freely within said open environment.

11. The method of claim 8, wherein said step of determining target characteristics is also based on optical signals blocked or reflected by targets moving freely within said open environment.

12. A method for determining target characteristics, comprising the steps of:

emitting at least two optical signals from a vertical cavity surface emitting laser structure through at least two apertures of an at least 2 aperture-by-at least 2 aperture array into an open environment wherein targets can move freely;

receiving optical signals transmitted from said open environment; and determining target characteristics based on optical signals reflected by at least one target moving freely within said open environment.

13. The method of claim 12, wherein said step of determining target characteristics is also based on optical signals not blocked by targets moving freely within said open environment.

14. The method of claim 12, wherein said step of determining target characteristics is also based on optical signals blocked by targets moving freely within said open environment.

15. The method of claim 12, wherein said step of determining target characteristics is also based on optical signals reflected by targets moving freely within said open environment.

* * * * *